(12) United States Patent
Park et al.

(10) Patent No.: US 7,724,572 B2
(45) Date of Patent: May 25, 2010

(54) INTEGRATED CIRCUIT HAVING A NON-VOLATILE MEMORY CELL TRANSISTOR AS A FUSE DEVICE

(75) Inventors: Jong-Wook Park, Chungcheongbuk-Do (KR); Sang-Jae Lee, Sungnam (KR); Myung-Gyoo Won, Suwon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 376 days.

(21) Appl. No.: 11/451,441

(22) Filed: Jun. 13, 2006

(65) Prior Publication Data

US 2006/0245280 A1 Nov. 2, 2006

Related U.S. Application Data

(62) Division of application No. 10/776,600, filed on Feb. 12, 2004, now Pat. No. 7,085,179.

(30) Foreign Application Priority Data

Feb. 25, 2003 (KR) ............................. 2003-11683

(51) Int. Cl.
*G11C 16/06* (2006.01)
(52) U.S. Cl. ..................... 365/185.09; 365/225.7; 365/200
(58) Field of Classification Search ............ 365/185.09, 365/225.7, 200
See application file for complete search history.

(56) References Cited

U.S. PATENT DOCUMENTS

| | | | |
|---|---|---|---|
| 5,300,840 A * | 4/1994 | Drouot ..................... | 365/200 |
| 6,031,771 A | 2/2000 | Yiu et al. | |
| 6,191,980 B1 | 2/2001 | Kelley et al. | |
| 6,407,946 B2 | 6/2002 | Maruyama et al. | |
| 6,452,248 B1 | 9/2002 | Le | |
| 6,621,734 B2 * | 9/2003 | Hamaguchi et al. .... | 365/185.09 |

* cited by examiner

*Primary Examiner*—Huan Hoang
(74) *Attorney, Agent, or Firm*—Volentine & Whitt, PLLC

(57) ABSTRACT

A semiconductor integrated circuit device has a fuse device that can be electrically disconnected without a breakage caused by using a laser beam or current. The semiconductor integrated circuit device employs, as the fuse device for storing status information, a MOSFET of a single polysilicon EEPROM-type cell manufactured through a process of fabricating a volatile semiconductor memory cell array.

7 Claims, 4 Drawing Sheets

INTEGRATED CIRCUIT HAVING A NON-VOLATILE MEMORY CELL TRANSISTOR AS A FUSE DEVICE

CROSS-REFERENCES TO RELATED APPLICATIONS

This application is a divisional of U.S. patent application Ser. No. 10/776,600, filed in the names of Jong-Wook Park et al. on 12 Feb. 2004, now U.S. Pat. No. 7,085,179. This application also claims priority under 35 U.S.C. §119 from Korean Patent Application 2003-11683, filed on Feb. 25, 2003, the contents of which are hereby incorporated by reference in their entirety for all purposes as if fully set forth herein.

BACKGROUND AND SUMMARY

1. Technical Field

The present invention relates to a semiconductor integrated circuit device. More particularly, the present invention relates to a semiconductor integrated circuit device having as a fuse device a non-volatile memory cell transistor fabricated by a volatile semiconductor memory process.

2. Description

Semiconductor memory devices are generally classified into volatile semiconductor memory devices and non-volatile semiconductor memory devices. The volatile semiconductor memory devices may be subdivided into dynamic random access memory devices and static random access memory devices. A volatile semiconductor memory device has the characteristic of losing contents stored in memory cells when an external power source supply is cut off.

Meanwhile, non-volatile semiconductor memory devices may be divided into mask read only memories (MROMs), programmable read only memories (PROMs), erasable programmable read only memories (EPROMs), electrically erasable programmable read only memories (EEPROMs), etc.

Such non-volatile semiconductor memory devices can permanently preserve the contents stored in the memory cells even though the external power source supply is cut off, thus the devices are usually used to store data to be preserved regardless of the supply of a power source. However, in general, users find it difficult to freely perform erase and write operations or programming operations with an MROM, PROM, or EPROM by itself in an electronic system. That is, it is not easy to erase or re-program the programmed contents in an on-board condition. Meanwhile, in the case of an EEPROM, the erase and write operation can be electrically performed in the system itself, thus its application to a system program storage device or auxiliary memory device necessary for a consecutive contents update is being increased gradually.

FIG. 6 shows a block diagram of a memory device including a volatile memory cell array, such as a DRAM (Dynamic Random Access Memory), or an SRAM (Static Random Access Memory), etc. The memory device also includes a redundancy memory cell array for replacing defective memory cells, memory cell address decoders, and a defective memory cell address storage circuit for storing addresses of defective memory cells.

In the meantime, a semiconductor integrated circuit device having a volatile memory cell array has generally employed a fuse for fault recovery (hereinafter, referred to as a "fuse device") in the defective memory cell address storage circuit in order to account for an electrical characteristic fault or defect of a memory cell. A polysilicon fuse composed of a polysilicon layer has been initially used as such a fuse device, and has been manufactured together in a process of forming a gate electrode of a metal oxide semiconductor field effect transistor (MOSFET), or a wiring layer.

Generally, in the past the fuse device has been cut by a light source, such as a laser beam, etc. However, such a laser cutting process cannot be performed on a packaged device, and must therefore be performed separately at the wafer or chip level. Further, if polysilicon melted in the laser cutting process remains in the neighborhood of the cut portion, it affects the fuse adjacent thereto, or the cut fuse may operate like a re-connected fuse, which may degrade the reliability of the fuse cutting process.

To solve such problems, a fuse cutting method using a current to "blow" or cut the fuse has been also used in this field, as shown in FIG. 1. In the example of FIG. 1, if the redundancy enable signal PREi is in a logical low ("L") state, it indicates that a defective address is not stored, and if it is in a logical high ("H") state, it indicates that an address of a defective memory cell is stored. However, if desired, the opposite logic levels or states could be used instead.

Referring to FIG. 1, the resistance value of a fuse device F1 made of a polysilicon layer is set much lower than a resistance value of the fixed resistance R. Thus, at an initial state when a supply voltage EVCC is applied, an address signal ADDR is applied as a low state, and an external drive signal MRS is applied as a high state, then the logic level of a node A becomes high ("H") and the logic level of a node B becomes low ("L"). Accordingly, the logic level of a redundancy enable signal PREi outputted from an output inverter IN2 becomes "L."

Meanwhile, in case a defective memory cell should be repaired, the supply voltage EVCC is applied and the address signal ADDR is provided as a high state. Thus, an N-type MOS transistor N1 for blowing the fuse F1 is turned on, and then an over-current starts flowing through the fuse device F1. That is, the fuse device F1 is broken by the over-current flowing from the fuse device F1 to a source terminal of the N-type MOS transistor N1. If the fuse device F1 is blown by the current, then the supply voltage EVCC cannot be applied to the source of the P-type MOS transistor P1 regardless of the state of the address signal ADDR, but is applied only through the resistance R. Therefore, when the drive signal MRS is applied as a high state, a logic level of the node A becomes "L" and a logic level of the node B becomes "H". Thus, a logic level of the redundancy enable signal PREi is outputted as "H", to repair a defective memory cell with a redundancy memory cell.

However, though the current blowing method referred to with respect to FIG. 1 has an advantage that the method can be used for a device in either a packaged state or a wafer state, there are still problems wherein the fuse device is re-connected after a breakage of the fuse device, or that layers near the fuse device are damaged by the breakage of the fuse.

To try to solve the breakage problem of the fuse device, an N-channel MOSFET having a floating gate has been provided as a fuse device in a volatile semiconductor memory device. In this case, a cutting operation of the transistor as the fuse device is performed by irradiating an electron beam generated by an electron beam apparatus through an opening part of an isolation layer formed on an upper part of the floating gate. That is, when electrons are injected into the floating gate, a threshold voltage of the N-channel MOSFET is varied. Thus the transistor functions as a fuse having an electrically cut state.

However, under the programmed state wherein the electrons are injected into the floating gate through the irradiation of the electron beam, it is difficult to return to the original state. The N-channel MOSFET has no control gate, like a memory cell transistor of an EEPROM has, and thus program and erase operations can not be performed with an applied voltage. Therefore, the N-channel MOSFET having the floating gate cannot perfectly perform an operation, like the memory cell transistor of an EEPROM.

A technique is therefore required that is-capable of easily fabricating a non-volatile memory cell as a fuse device that can perform an operation like the memory cell transistor of an EEPROM, using a fabrication process of a volatile semiconductor memory such as a DRAM, an SRAM, etc.

However, a general non-volatile semiconductor memory, e.g., a memory cell transistor of an EEPROM, requires a high voltage, e.g., about 10-18 volts for a programming voltage, and needs a read voltage of about 5 volts. Thus, a chip internally employs a high voltage pump circuit, and a memory cell transistor has a floating gate surrounded with a dielectric film and has a control gate formed on an upper part of the floating gate, which is quite different from a general MOSFET. That is, such a process of fabricating the non-volatile semiconductor memory is much different from a fabrication process of a volatile semiconductor memory cell. There are many difficulties to manufacture the memory cell transistor of an EEPROM under the fabrication environment of the volatile semiconductor memory device such as a DRAM, etc., without an additional process or a change of the process.

Accordingly, it would be desirable to provide a fuse device of a volatile semiconductor memory device capable of solving problems of the prior art.

It would further be desirable to provide a semiconductor integrated circuit device having as a fuse device a non-volatile memory cell transistor fabricated in a fabrication process of a volatile semiconductor memory.

It would further be desirable to provide a fuse device that can be electrically cut without a breakage caused by using a laser beam or current.

It would still further be desirable to provide a method of manufacturing a fuse device through a fabrication process of a volatile semiconductor memory, and a structure of the fuse device therefor, which is capable of operating like a memory cell transistor of an EEPROM.

It would additionally be desirable to provide a structure of a fuse device capable of performing an operation like a memory cell transistor of an EEPROM at a voltage lower than an operating voltage of typical, existing EEPROMS.

It would still additionally be desirable to provide a structure of an EEPROM memory cell transistor as a fuse device capable of performing an operation like the memory cell transistor of the EEPROM within an operating voltage range of a volatile semiconductor memory device.

Furthermore, it would also be desirable to provide a non-volatile memory cell transistor having a single-polysilicon-layer structure in which a fuse device can be cut without a breakage, being fabricated under a DRAM fabrication environment, and that can be repaired to an original uncut state when necessary.

Moreover, it would be desirable to provide a structure of an EEPROM memory cell transistor used as a fuse device, whereby an address of a defective bit is stored, or a mode entry signal indicating an entry into a specific operating mode such as a test mode etc., is stored.

It would be yet further desirable to provide a semiconductor integrated circuit device having a fuse device that can be cut without a breakage and repaired even while in a packaged state.

It would be yet still further desirable to provide a defective memory cell address storage circuit of a semiconductor integrated circuit device having as a fuse device a non-volatile memory cell transistor manufactured in a fabrication process of a volatile semiconductor memory.

To these ends, according to one aspect of the present invention, an integrated circuit device having a semiconductor substrate comprises: a memory cell array comprising a plurality of volatile memory cells; and a metal oxide semiconductor field effect transistor (MOSFET) configured as a non-volatile electrically erasable programmable read only memory (EEPROM) device having a floating gate and a control gate, and adapted to store status information associated with the memory cell array, wherein the MOSFET has a single polysilicon film for the floating gate, and the control gate is disposed within a well in the semiconductor substrate.

The single polysilicon layer of the MOSFET corresponds to a charge storage floating gate of an EEPROM, and a control gate of the EEPROM is spaced from a channel region of the MOSFET and can be composed of an ion-implantation region formed beneath the single polysilicon layer. The MOSFET can be an n-channel MOSFET, in which case a programming operation for electrically blowing or cutting the fuse device can be performed by injecting electrons into the floating gate through a hot electron injection method. Further, an erase operation for electrically connecting the fuse device can be performed by discharging electrons captured by the floating gate through an F-N (Fowler-Nordheim) tunneling system.

According to another aspect of the present invention, an integrated circuit device having a semiconductor substrate comprises: a memory cell array comprising a plurality of volatile memory cells; at least one redundancy volatile memory cell; and an electrically programmable non-volatile memory cell configured as a fuse device to identify whether a corresponding one of the memory cells is defective and should be replaced with the redundancy memory cell.

According to yet another aspect of the present invention, an integrated circuit device, comprises: a plurality of volatile memory cells; a redundancy memory-cell; and a defect repair circuit for replacing a defective memory cell, among the plurality of volatile memory cells, with the redundancy memory cell, wherein the defect repair circuit includes a fuse device comprising a MOSFET having a floating gate and a control gate, said MOSFET being changed from a first threshold voltage level to a second threshold voltage level in response to an applied programming control signal, and being changed from the second threshold voltage level to the first threshold voltage level in response to an applied erase control signal, to electrically disconnect and connect the fuse device, and wherein the MOSFET has a single polysilicon film for the floating gate, and the control gate is disposed within a well in the semiconductor substrate According to still another aspect of the present invention, a defective memory cell address storage circuit for a semiconductor integrated circuit device comprises: a MOSFET, having a source, a drain connected to a first power supply voltage, a floating gate, and a control gate connected to a second power supply voltage, the MOSFET being configured as a fuse device for storing status information for the integrated circuit device; an operation enabler for connecting a source of the MOSFET to a ground voltage in response to a status of an enable signal; and a latch for latching, as the status information, a voltage level appearing at the source of the MOSFET according to a threshold voltage of the MOSFET, to store a defective memory cell address, wherein the MOSFET has a single polysilicon film for the floating gate, and the control gate is disposed within a well in the semiconductor substrate.

The MOSFET, configured as a single-polysilicon-layer EEPROM-type cell, functions as a fuse device for storing status information. A drain is connected to a first power supply voltage and a control gate is connected to a second power supply voltage. Further, the MOSFET is manufactured through a fabrication process of a volatile semiconductor memory.

The operation enabler connects a source of the MOSFET to a ground voltage in response to a state of an enable signal.

The latch latches, as the status information, a voltage level appearing at a source of the MOSFET according to the threshold voltage of the MOSFET, to indicate whether an address of a defective memory cell is stored.

The MOSFET of the single-polysilicon-layer EEPROM-type cell is manufactured by the fabrication process of a volatile semiconductor memory.

According to a further aspect of the present invention, a dynamic random access memory device comprises: a MOSFET configured as a fuse device for storing status information for the memory device, said MOSFET including, a substrate having a first conductivity type; a first well formed in a first portion of the substrate and having a second conductivity type; a pocket well formed within the first well, the pocket well having the first conductivity type; source and drain regions formed in a portion of the pocket well; a second well formed in a second portion of the substrate, being spaced from the first well, the second well having the second conductivity type; a control gate formed in a portion of the second well; a floating gate of polysilicon material at least partially extending over and overlapping the control gate, extending above and overlapping portions of the pocket well and the first well in a direction approximately perpendicular to a source-drain channel between the source and the drain; and a tunnel oxide interposed between the floating gate and the substrate.

Further, the erase operation is obtained, through a grounding of the source of the MOSFET, and by applying the first and second power supply voltages of about 5 volts and 0 volts, respectively. The read operation is performed by floating of the source of the MOSFET and by applying both the first and second power supply voltages of about 2.0-3.0 volts.

The operation enabler may be provided as an N-type MOS transistor, and the latch can be an inverter latch whose input terminals are connected together with its output terminals. An output inverter for inverting and outputting an output of the latch can be further equipped therewith.

Herewith, the second conductivity type can be an n-type conductivity while the first conductive type is p-type conductivity.

BRIEF DESCRIPTION OF THE DRAWING

The present invention will become more fully understood from the detailed description given below and the accompanying drawings which are given by way of illustration only and thus are not limitative of the present invention, and wherein.

DETAILED DESCRIPTION

Hereinafter, preferred embodiments of the present invention will be described in detail with reference to FIGS. 2 through 5 in which like components having like functions have been provided with like reference symbols and numerals.

It will be understood by those skilled in the art that the present invention can be embodied by numerous different types and is not limited to the following described embodiments. The following various embodiments are exemplary in nature.

A semiconductor integrated circuit device having a memory cell array of volatile memory cells, one or more redundancy volatile memory cells, and a defective memory cell address storage circuit will be described as follows. In the device, the defective memory cell address storage circuit includes, as a fuse device, a non-volatile memory cell transistor fabricated by a process of a volatile semiconductor memory device.

Figure 1:
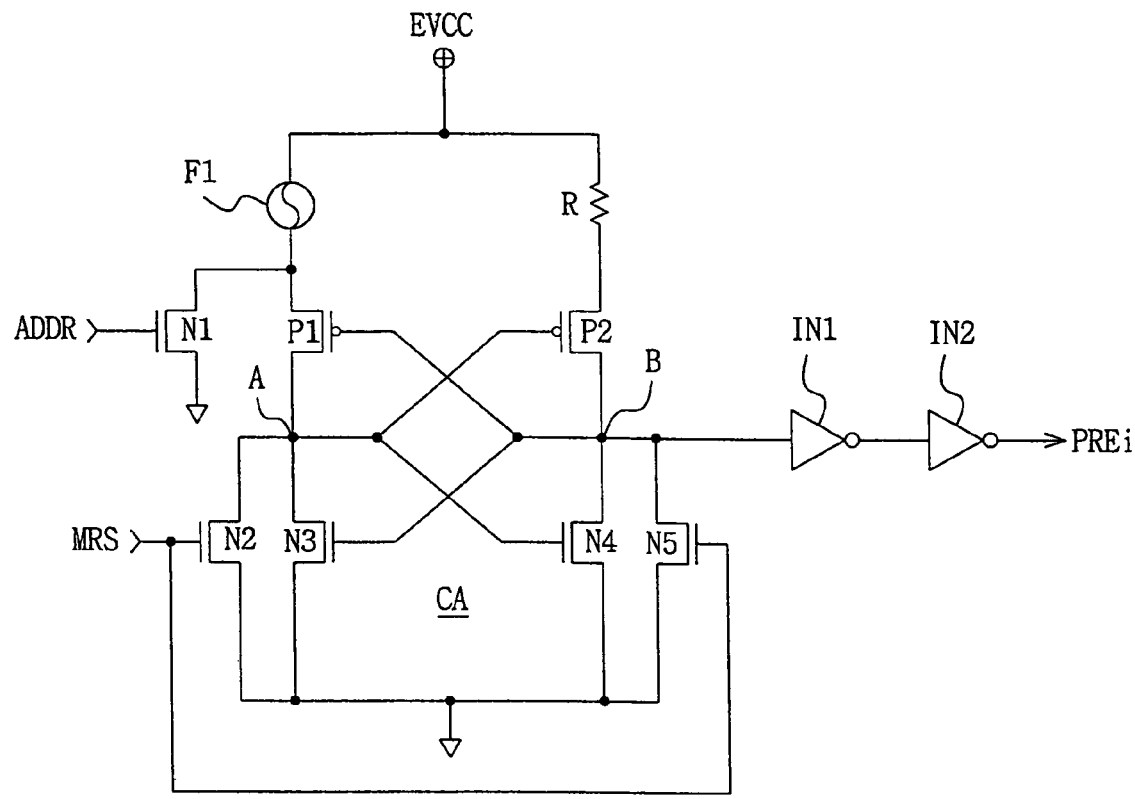
FIG. 1 is a circuit diagram of a defect address storage circuit using a general current blowing method.
Figure 2:
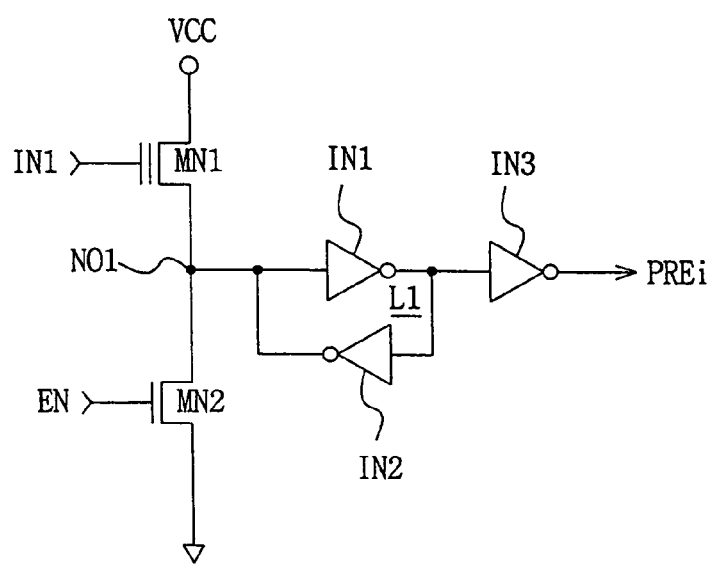
FIG. 2 is a circuit diagram of a defect address storage circuit according to an exemplary embodiment of the present invention.

FIG. 2 is a circuit diagram of a defective memory cell address storage circuit of a semiconductor integrated circuit device. Referring to FIG. 2, the defective memory cell address storage circuit of a semiconductor integrated circuit device includes a fuse device MN1, an operation enabler MN2, a latch L1, and an output inverter IN3.

In the fuse device MN1, a drain is connected to a first power supply voltage VCC and a control gate is connected to a second power supply voltage IN1, so that the fuse device MN1 functions to store status information. The fuse device MN1 is provided as the MOSFET MN1 of a single-polysilicon-layer EEPROM-type cell manufactured by a process used to fabricate a volatile semiconductor memory device.

In an N-type MOS transistor MN2 functioning as the operation enabler, a drain is connected to a connection node NO1, and a source is grounded. If the state of an enable signal EN, which can be provided as a mode register set (MRS) code, is a logical high ("H"), then the N-type MOS transistor MN2 is turned on to connect a source of the MOSFET MN1 of the EEPROM-type cell to ground voltage. The NMOS transistor MN2 is turned on by the enable signal EN that is applied as "H" only in programming and erase operation modes.

The latch L1 latches, as the status information, a voltage level appearing in the source of the MOSFET MN1 according to a change of threshold voltage of the MOSFET MN1, in case a defect address is stored.

To reduce a current consumption in a read operation, the fuse device MN1 shown in FIG. 2 functions as an on-cell only in case the fuse device MN1 should store an address of a defective memory cell. Thus, initially, a plurality of fuse devices are all programmed and provided in an off-cell state. Under such a state, only fuse devices for storing addresses of defective memory cells are selectively erased and become in the on-cell state. That is, the transistor MN1 having a threshold voltage increased through a programming operation operates as an off-cell in the read operation, and the transistor MN1 having a threshold voltage lowered through the selective erase operation operates as an on-cell in the read operation.

For example, if the transistor MN1 of FIG. 2 is an erased cell transistor, the transistor MN1 functions as an on-cell in the read operation and a logic level "H" is provided at the node NO1. Thus, a logic level of a redundancy enable signal PREi of an inverter IN3 for inverting an output of the latch L1 is outputted as a logic "H." Therefore, a corresponding normal memory cell is replaced with a redundancy memory cell.

Meanwhile, if the transistor MN1 of FIG. 2 is a programmed cell transistor, the transistor MN1 functions as an off-cell in the read operation and a logic level "L" is provided at the node NO1. Thus a logic level of the redundancy enable signal PREi of the inverter IN3-is outputted as a logic "L." That is, a corresponding normal memory cell performs an original cell function without a replacement by a redundancy memory cell.

Consequently, if a defective bit for a memory is changed with a connection circuit, the circuit of FIG. 2 functions as a defective bit address storage circuit for latching an address of the defective bit according to a conductive or non-conductive state of the fuse device MN1. Meanwhile, the fuse device MN1 employs a non-volatile memory device manufactured in a volatile semiconductor memory device fabrication environment.

Though the fuse device of FIG. 2 was described above as an example for the case used within the defective address storage circuit, in case a mode entry signal indicating an entry to a specific operating mode such as a test mode etc. is stored, it can be, of course, used as the fuse device.

Further, if the MOSFET MN1 of the single-polysilicon-layer EEPROM-type cell is erased by a working fault, the transistor MN1 is restored to an off-cell once a programming is re-executed. This is also efficient when again restoring an original condition after performing a test.

Next, a structure of an exemplary embodiment of the fuse device of FIG. 2, namely, the MOSFET MN1 of the single-polysilicon-layer EEPROM-type cell, will be described.

Figure 3:
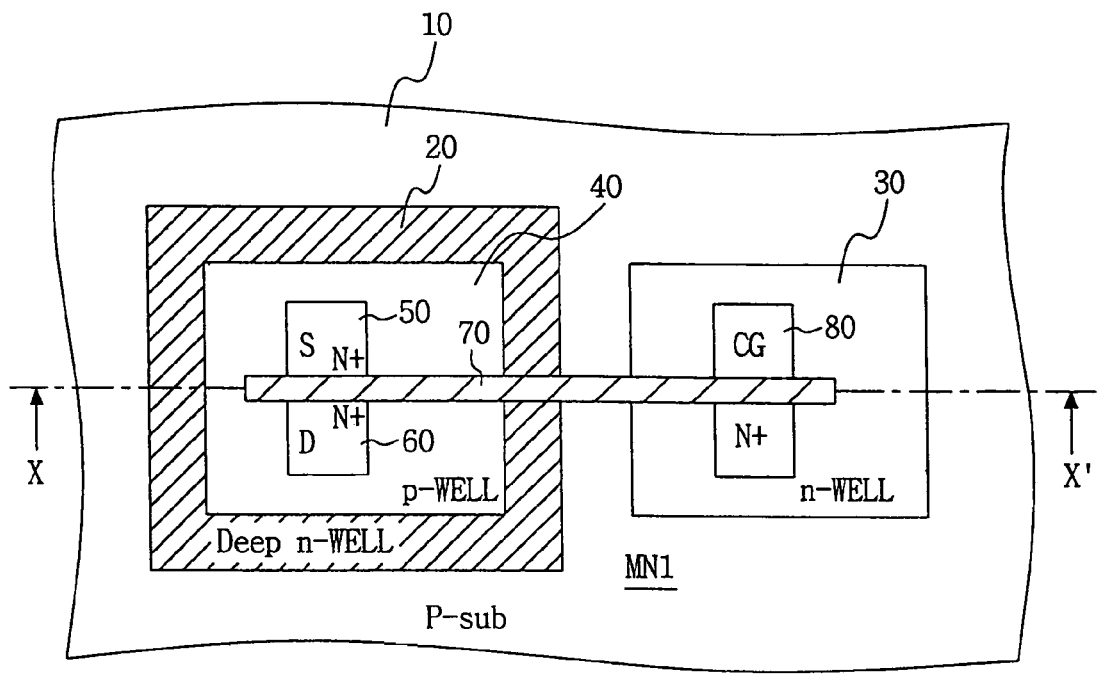
FIG. 3 is a layout of a fuse device referred to with respect to FIG. 2, provided as a non-volatile memory cell transistor having a single-polysilicon-layer structure.
Figure 4:
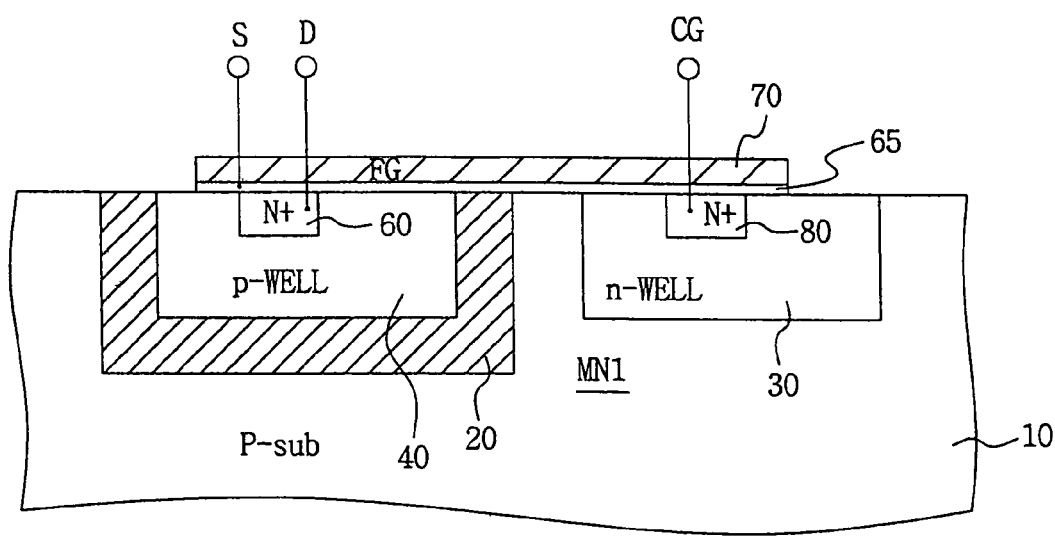
FIG. 4 is a sectional view of an X-X' line referred to in FIG. 3.

FIG. 3 illustrates a layout of an exemplary embodiment of the fuse device shown to FIG. 2, and FIG. 4 is a sectional view taken along the line X-X' of FIG. 3. Referring to FIGS. 3 and 4, a substrate 10 having a first conductivity type is formed as a P-type semiconductor substrate made of single-crystal silicon. A first (deep) well 20 having a second conductivity type is formed on one portion of the substrate 10 through an ion implantation process of selectively ion-implanting an n–type impurity. In the deep well 20, a pocket well 40 of the first conductivity type is formed through an ion-implantation process of injecting p-type ions. Source region 50 and drain region 60 are formed by injecting n+type ions into a portion of the p-type pocket well 40. Meanwhile, a second well 30 having the second conductivity type is spaced apart from the first (deep) well 20, and is formed on another portion of the substrate 10. An n+region of the second conductivity type is formed by ion implantation on a portion of the second conductive well 30 and functions as a control gate 80 of the MOSFET MN1. Because the control gate 80 is formed within the n-well 30, there is no need to specifically form another polysilicon film on top of the floating gate 70. Thus, a structure of the single-polysilicon-layer EEPROM-type cell in which only the floating gate is formed with a polysilicon film, can be realized with a tunnel oxide film 65, having a thickness of about 70 Å through 100 Å, and a charge storage floating gate 70 formed lengthwise above a channel region as a boundary region between the source 50 and the drain 60, and above portions of the first conductive pocket well 40, the second conductive deep well 20, the substrate 10, the second conductive well 30, and the control gate 80. That is, the floating gate 70 is formed to extend over and overlap the control gate 80, and to extend over and overlap portions of the first conductive pocket well 40 and the second conductive deep well 20, in a direction roughly perpendicular to the source-drain channel.

The floating gate 70 is made of a polysilicon layer material deposited through a chemical vapor deposition, and functions as a charge storage floating gate of an EEPROM-type cell. The floating gate 70 is formed as a single polysilicon layer above the tunnel oxide film 65, and can be made simultaneously when a gate of a transistor is manufactured in a DRAM fabrication process. Though the source 50 and the drain 60, and the control gate 80 are formed under the floating gate 70 as shown in the drawing, beneficially they are actually manufactured through an ion-implantation and a diffusion process after fabricating the floating gate 70.

In the exemplary embodiment, the MOSFET MN1 of the single-polysilicon-layer EEPROM-type cell having such a structure is manufactured by a process of fabricating a volatile semiconductor memory such as a DRAM etc., and is used as a fuse device for storing status information.

An operation of the fuse device MN1 having such a configuration has programming, erase, and read operating modes, the same as the EEPROM memory cell transistor, while the fuse device MN1 is different therefrom only in respect to the applied voltage.

First, the programming operation will be explained. The programming operation is performed by applying a voltage (second power supply voltage) of about 5 volts or more to the control gate, a ground voltage to a source terminal, and a voltage of about 3 volts or more (first power supply voltage) to a drain terminal of the memory cell transistor MN1. Once the voltage is applied, hot electrons generated in a channel formed on a silicon interface contacted with a gate oxide film are injected into the floating gate 70. Once a negative (−) charge is sufficiently accumulated in the floating gate 70, the threshold voltage of the memory cell transistor MN1 increases to be greater than the threshold voltage before it was programmed, and the memory cell transistor MN1 thus functions as an off-cell. The threshold voltage of the programmed memory cell transistor MN1 has a voltage distribution of about 4V-6V.

Next, the erase operation will be explained. The erase operation is performed by applying a ground voltage to the control gate, and a voltage of about 5 volts or more to the source terminal or the drain terminal of the memory cell transistor MN1. The other terminal among the source and drain terminals, to which the 5 volts is not applied, becomes grounded. When this voltage is applied to the source or drain, electrons injected into the floating gate are discharged through a Fowler-Nordheim (F-N) tunneling method, thus changing the threshold voltage to return to its original particular "native" threshold voltage. When the F-N tunneling occurs, a negative (−) charge captured within the floating gate 70 is discharged to the source or drain. It is generally known that the F-N tunneling occurs when electric field of 6-7 MV/cm across an isolation film is applied to a conductive layer. In the memory cell transistor, the tunnel oxide film 65 is formed with thickness of about 80 Å, thus the F-N tunneling can occur.

Finally, the read operation will be explained. Beneficially, the read operation is performed by applying a voltage of between 2.5-3.0V (first supply voltage) to the drain and 2.0-2.5V (second supply voltage) to the control gate of the memory cell transistor MN1 under such a state that the source region floats. In the read operation, the memory cell transistor MN1 whose threshold voltage has been increased by the programming operation operates as an off-cell to thus cut off current flow between the drain and the source of the device. In this case the memory cell transistor operates as an "off-cell."

During the read operation, a memory cell having a threshold voltage that has been reduced by the erase operation, has a current path formed between the drain region and the source region, and operates as an on-cell. In this case the memory cell transistor is called an "on-cell." The threshold voltages of erased memory cell transistors generally have a voltage distribution of about 1V through 2V.

The operating modes based on the applied voltage conditions are arranged as shown in Table 1 below.

TABLE 1

| Operating Mode | IN1 (Control Gate) | VCC (Drain) | S/L (Source) |
|---|---|---|---|
| Program | +5 V | +2.5~3 V | 0 V |
| Erase | 0 V | +5 V | 0 V |
| Read | +2.0~2.5 V | +2.5~3 V | Floating |

As shown in Table 1, the fuse device disclosed above can perform an operation like the memory cell transistor of the EEPROM within an operating voltage range of a volatile semiconductor memory.

As shown in FIGS. 3 and 4, the reason why the field effect transistor having the source 50 and the drain 60 is disposed within the deep n-well 20, is to prevent a short from other elements in the erase operation. In other words, a PN junction is generated between the control gate and the drain terminal receiving a high voltage in the erase operation, and if there is no deep n-well, an electrical short from other elements may be caused in the substrate.

Figure 5:
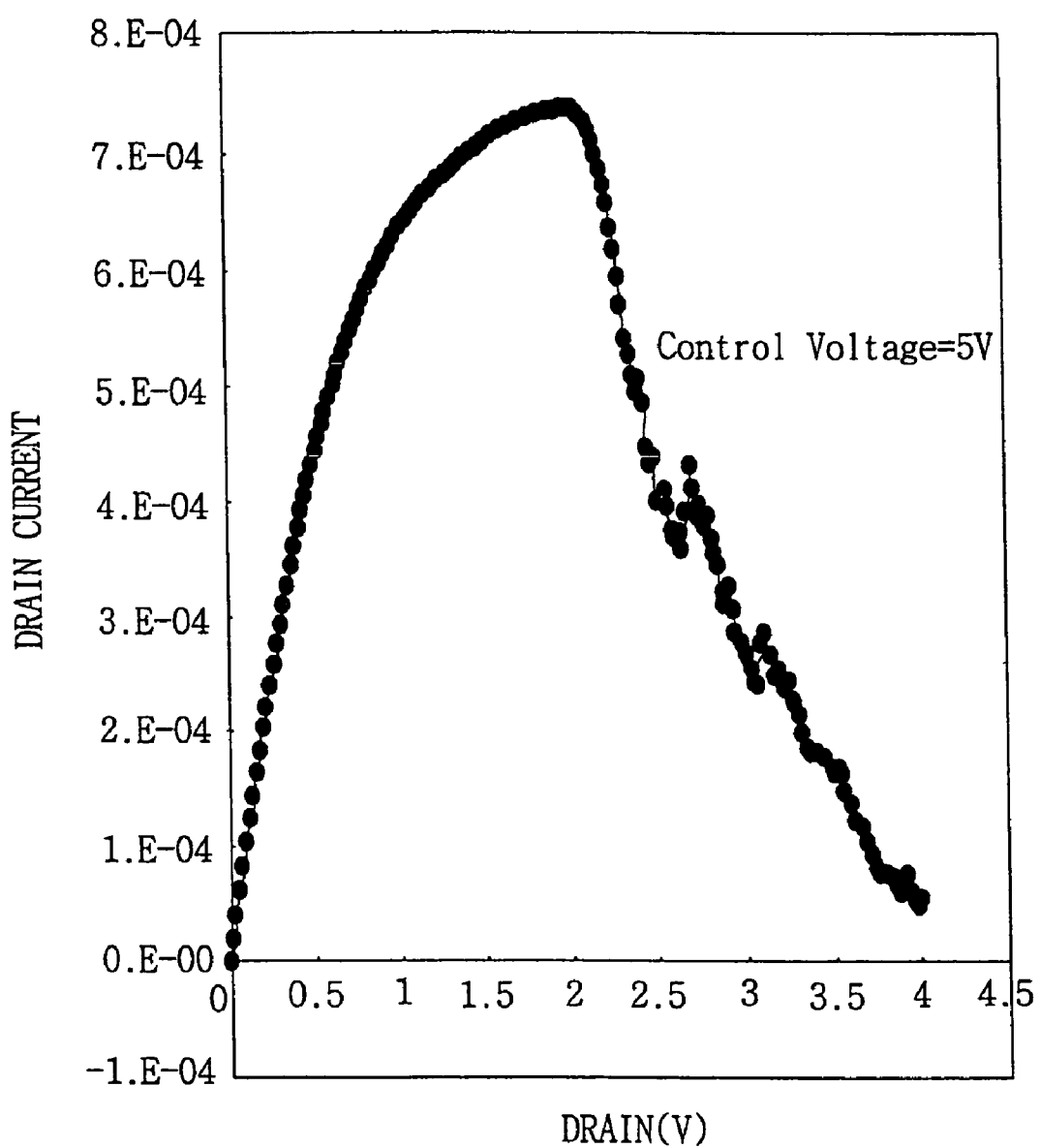
FIG. 5 is a graph illustrating a program operating characteristic of the fuse device shown in FIG. 2.
Figure 6:
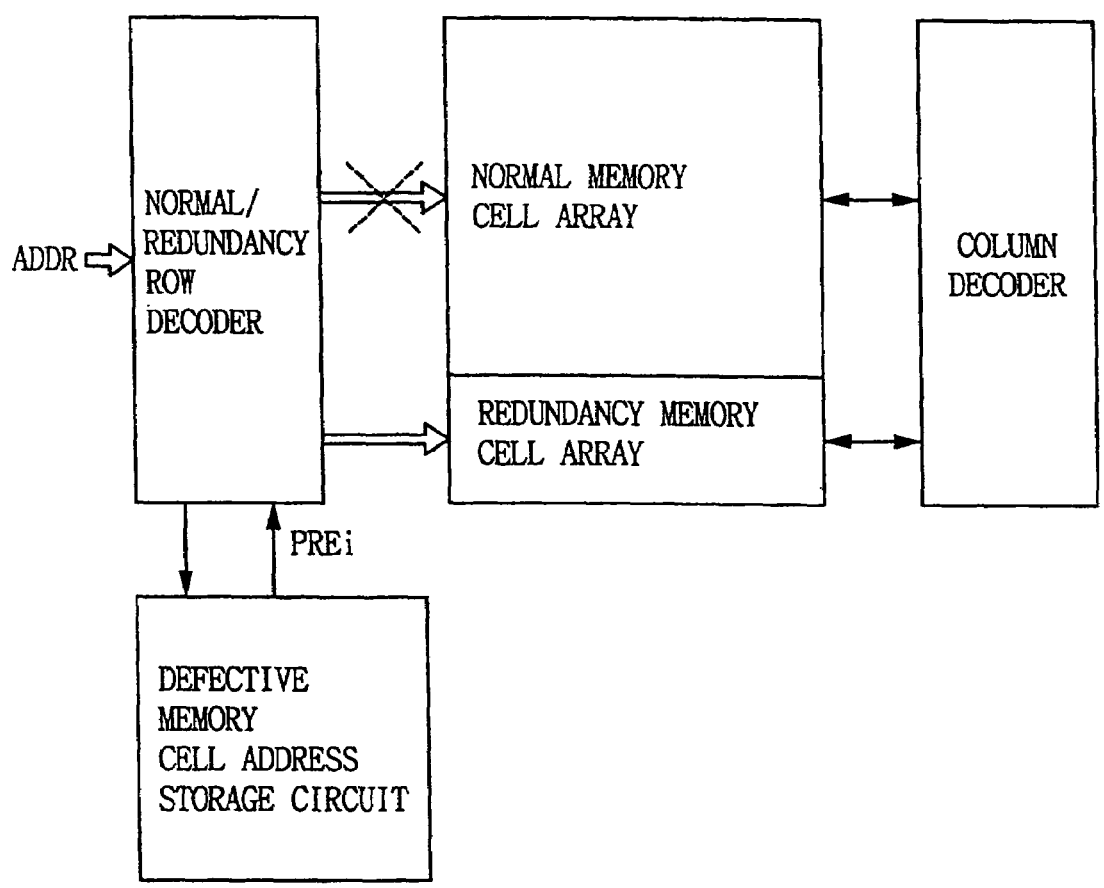
FIG. 6 is a block diagram of a memory device.

FIG. 5 is a simulation graph illustrating a programming operation characteristic of the fuse device shown in FIG. 2. Referring to FIG. 5, the horizontal axis indicates drain voltage, and the vertical axis designates drain current. The graph describes a case wherein an N-type MOS transistor having a channel length of 0.6 μm is manufactured through a CMOS fabrication process to have an LDD structure. Herewith, as a result, the coupling ratio of the N-type MOS transistor functioning as the fuse device is about 0.7~0.8, and the programming operation is performed at a region where the drain voltage is 3V in case a voltage applied to the control gate is about 5V. Also, if the channel length is reduced, the applied programming voltage can be reduced.

As described above, the fuse device is electrically cut without breakage caused by using a laser beam or a current. In addition, an operation like a memory cell transistor of an EEPROM can be performed within an operation voltage range of a volatile semiconductor memory.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For instance, transistor devices employed in the circuit can be changed to an opposite type to that shown in the various figures, or a connection construction of the circuit can be diversely varied. Accordingly, these and other changes and modifications are seen to be within the true spirit and scope of the invention as defined by the appended claims.

What is claimed is:

1. A defective memory cell address storage circuit for a semiconductor integrated circuit device, said circuit comprising:
a MOSFET, having a source, a drain connected to a first power supply voltage, a floating gate, and a control gate connected to a second power supply voltage, the MOSFET being configured as a fuse device for storing status information for the integrated circuit device;
an operation enabler for connecting a source of the MOSFET to a ground voltage in response to a status of an enable signal; and
a latch for latching, as the status information, a voltage level appearing at the source of the MOSFET according to a threshold voltage of the MOSFET, to store a defective memory cell address,
wherein the MOSFET has a single polysilicon film for the floating gate, and the control gate is disposed within a well in the semiconductor substrate.

2. The circuit as claimed in 1, wherein the source of the MOSFET is grounded, and wherein the first and second power supply voltages are about 3 volts and 5 volts, respectively, during a programming operation.

3. The circuit as claimed in 2, wherein the source of the MOSFET is grounded, and the first and second power supply voltages are about 5 volts and 0 volts, respectively, during an erase operation.

4. The circuit as claimed in 3, wherein the source of the MOSFET floats and both the first and second power supply voltages are each about 3 volts during a read operation.

5. The circuit as claimed in 1, wherein the operation enabler is an N-type MOS transistor.

6. The circuit as claimed in 1, wherein the latch is an inverter latch having two inverters in which an input terminal of each inverter is connected with an output terminal of the other inverter.

7. The circuit as claimed in 1, further comprising an output inverter for inverting and outputting an output of the latch.

* * * * *